(12) United States Patent
MacLean et al.

(10) Patent No.: US 6,795,955 B2
(45) Date of Patent: Sep. 21, 2004

(54) METHOD AND APPARATUS FOR IDENTIFYING AN IDENTICAL CELL IN AN IC LAYOUT WITH AN EXISTING SOLUTION

(75) Inventors: Kevin D. MacLean, Los Gatos, CA (US); Roger W. Sturgeon, Fort Lauderdale, FL (US)

(73) Assignee: Numerical Technologies, San Jose, CA (US)

( * ) Notice: Subject to any disclaimer, the term of this patent is extended or adjusted under 35 U.S.C. 154(b) by 305 days.

(21) Appl. No.: 10/098,713

(22) Filed: Mar. 15, 2002

(65) Prior Publication Data

US 2003/0188283 A1 Oct. 2, 2003

(51) Int. Cl.[7] .................. G06F 17/50; G06F 19/00; G21K 5/00; G03F 9/00
(52) U.S. Cl. .................. 716/10; 716/21; 430/5; 378/35
(58) Field of Search ................... 716/10, 21; 430/5; 378/35

*Primary Examiner*—Matthew Smith
*Assistant Examiner*—Phallaka Kik
(74) *Attorney, Agent, or Firm*—Park, Vaughan & Fleming LLP

(57) ABSTRACT

One embodiment of the invention provides a system for speeding up processing of a layout of an integrated circuit that has been divided into cells. The system operates by determining if a target cell in the layout is identical to a preceding cell for which there exists a previously calculated solution by comparing an identifier created from the target cell with an identifier created from the preceding cell. If the target cell is identical to a preceding cell, the system uses the previously calculated solution as a solution for the target cell. Otherwise, if the target cell is not identical to the preceding cell, the system processes the target cell to produce the solution for the target cell. Note that this approach can also be used for a number of different processes, such as distributed fracturing or optical proximity correction.

23 Claims, 8 Drawing Sheets

METHOD AND APPARATUS FOR IDENTIFYING AN IDENTICAL CELL IN AN IC LAYOUT WITH AN EXISTING SOLUTION

RELATED APPLICATION

The subject matter of this application is related to the subject matter in a co-pending non-provisional application by the same inventors as the instant application and filed on the same day as the instant application entitled, "Using a Suggested Solution to Speed Up a Process for Simulating and Correcting an Integrated Circuit Layout," having Ser. No. 10/098,714 and filing date 15 Mar. 2002, now U.S. Patent Application Publication No. 20030177465.

BACKGROUND

1. Field of the Invention

The invention relates to the process of fabricating semiconductor chips. More specifically, the invention relates to a method and an apparatus for using a suggested solution to speed up an iterative process, such as optical proximity correction, for simulating and correcting a layout on a semiconductor chip.

2. Related Art

Recent advances in integrated circuit technology have largely been accomplished by decreasing the feature size of circuit elements on a semiconductor chip. As the feature size of these circuit elements continues to decrease, circuit designers are forced to deal with problems that arise as a consequence of the optical lithography process that is typically used to manufacture integrated circuits. This optical lithography process begins with the formation of a photoresist layer on the surface of a semiconductor wafer. A mask composed of opaque regions, which are formed of chrome, and light-transmissive clear regions, which are generally formed of quartz, is then positioned over this photo resist layer coated wafer. (Note that the term "mask" as used in this specification is meant to include the term "reticle.") Light is then shone on the mask from a visible light source, an ultraviolet light source, or more generally some other type of electromagnetic radiation together with suitably adapted masks and lithography equipment.

This light is reduced and focused through an optical system that contains a number of lenses, filters and mirrors. The light passes through the clear regions of the mask and exposes the underlying photoresist layer. At the same time, the light is blocked by opaque regions of the mask, leaving underlying portions of the photoresist layer unexposed.

The exposed photoresist layer is then developed, through chemical removal of either the exposed or non-exposed regions of the photoresist layer. The end result is a semiconductor wafer with a photoresist layer having a desired pattern. This pattern can then be used for etching underlying regions of the wafer.

One problem that arises during the optical lithography process is "line end shortening" and "pullback". For example, the upper portion of FIG. 1 illustrates a design of a transistor with a polysilicon line 102, running from left to right, that forms a gate region used to electrically couple an upper diffusion region with a lower diffusion region. The lower portion of FIG. 1 illustrates a printed image that results from the design. Note that polysilicon line 102 has been narrowed using optical phase shifting in order to improve the performance of the transistor by reducing the resistance through the gate region.

Also note that because of optical effects and resist pullback there is a significant amount of line end shortening. This line end shortening is due to optical effects that cause the light to expose more of the resist under a line end than under other portions of the line.

In order to compensate for line end shortening, designers often add additional features, such as "hammer heads," onto line ends (see top portion of FIG. 2). The upper portion of FIG. 2 illustrates a transistor with a polysilicon line 202, running from left to right, which forms a gate region used to electrically couple an upper diffusion region with a lower diffusion region. A hammer head 204 is included on the end of polysilicon line 202 to compensate for the line end shortening. As is illustrated in the bottom portion of FIG. 2, these additional features can effectively compensate for line end shortening in some situations.

These additional features are typically added to a layout automatically during a process known as optical proximity correction (OPC). For example, FIG. 3 illustrates line end geometry 302 (solid line) prior to OPC and the resulting corrected line end geometry 304 after OPC (dashed line). Note that the corrected line end geometry 304 includes regions with a positive edge bias in which the size of the original geometry 302 is increased, as well as regions of negative edge bias in which the size of the original geometry 302 is decreased.

Performing an operation, such as OPC, can be extremely time-consuming, because the operation typically involves numerous iterations of a time-consuming modeling and correction process. Furthermore, the operation must be applied to all of the cells that comprise a layout of an integrated circuit.

In order to speed up operations such as OPC, existing systems often perform hierarchical processing on a layout to identify identical cells that have the same surrounding environment. (Within this specification and the associated claims, the term "cell" refers to a unit of design, such as an arbitrary geometric region or potion of the layout.) If such identical instances of cells are identified, the existing systems can use a solution computed for one cell as a solution for all other identical instances of the cell. This saves a great deal of time for layouts that contain many instances of the same cell.

Unfortunately, existing systems cannot reuse solutions in cases where identical cells have different surrounding environments, or when a layout of a given cell differs only slightly from the layout of another cell.

Moreover, existing systems do a poor job of distributing the workload involved in computing solutions for cells across multiple processing nodes that are typically available in high-performance computing systems.

What is needed is a method and an apparatus that reuses a solution for a given cell in computing a solution for a cell with a different environment and/or a slightly different layout.

SUMMARY

One embodiment of the invention provides a system for speeding up an iterative process that simulates and corrects a layout of a target cell within an integrated circuit so that a simulated layout of the target cell matches a desired layout for the target cell. The system operates by determining if the target cell is similar to a preceding cell for which there exists a previously calculated solution. If so, the system uses the previously calculated solution as an initial input to the iterative process that produces the solution for the target cell.

In a variation on this embodiment, the target cell is similar to the preceding cell if the layout of the target cell matches the layout of the preceding cell but the environment surrounding the target cell differs from the environment surrounding the preceding cell.

In a variation on this embodiment, if the previously calculated solution for the preceding cell is used as the initial input to the iterative process, the iterative process only operates on features within a border region located just inside the outside edge of the target cell that can be affected by the environment surrounding the target cell, and ignores features within the target cell that are not located within the border region.

In a variation on this embodiment, the target cell is similar to the preceding cell if the layout of the target cell differs from the layout of the preceding cell by less than a pre-specified amount. For example, in one embodiment of the present invention, the target cell is similar to the preceding cell if a specific percentage (say 95%) of the layout of the target cell is identical to the layout of the preceding cell.

In a variation on this embodiment, if the previously calculated solution for the preceding cell is used as the initial input for the iterative process, and if the iterative process produces a simulation result that differs significantly from the desired layout, the system restarts the iterative process using the desired layout instead of the previously calculated solution as the initial input to the iterative process.

In a variation on this embodiment, while performing the iterative process the system repeatedly simulates a current solution for the target cell to produce a current simulated layout. If the current manufactured result as determined by simulation (or "simulated layout") differs from the desired layout by less than a pre-specified amount, the system accepts the current solution as a final solution for the target cell. Otherwise, the system corrects the current solution to compensate for differences between the current simulated layout and the desired layout.

Note that the term "simulates" as used in this specification and the associated claims refers to both simulation of optical effects as well as modeling of mask writing (e.g. E-Beam), resist and/or etch effects.

Thus, in one embodiment of the present invention, there are three primary outcomes from using the suggested solution approach: (1) further simulation and correction time are saved because the previous solution is accepted, additionally data volume can be significantly reduced; (2) the previous solution is further modified, but simulation and correction times are still significantly reduced since generally fewer edges are simulated and corrected; or (3) the previous simulation results are discarded and there is only a minor overall time penalty relative to the vast savings. Moreover, there are often significant data volume reductions.

In a variation on this embodiment, prior to considering the target cell, the system receives a specification for the layout of the integrated circuit, and divides the layout into a plurality of cells, whereby each cell can be independently subjected to the iterative process.

In a variation on this embodiment, the iterative process performs model-based optical proximity correction (OPC).

One embodiment of the invention provides a system for speeding up processing of a layout of an integrated circuit that has been divided into cells. The system operates by determining if a target cell in the layout is identical to a preceding cell for which there exists a previously calculated solution by comparing an identifier created from the target cell with an identifier created from the preceding cell. Note that the identifiers, which are also referred to as hash codes, hash keys or message digests, are computed from properties and/or descriptions of the respective cells. Hence, the terms "hash code" and "identifier" are used interchangeably throughout this specification and associated claims, and are meant to refer to values computed from properties and/or descriptions of cells.

If the target cell is identical to a preceding cell, the system uses the previously calculated solution as a solution for the target cell. Otherwise, if the target cell is not identical to the preceding cell, the system processes the target cell to produce the solution for the target cell. Note that this approach can also be used for a number of different processes, such as distributed fracturing or optical proximity correction.

In a variation on this embodiment, if the hash code created from the target cell matches the hash code created from the preceding cell, the system compares the complete layout of the target cell with the complete layout of the preceding cell to ensure that the target cell is identical to the preceding cell. This is useful because it may be possible for two different cells to have identical identifiers even though the cells are not the same. If the relative cost of comparing the layouts (geometrical boolean operations) is less than the cost of detecting the error after doing the other processing, this is usually a desirable option.

In a variation on this embodiment, determining if the target cell is identical to a preceding cell involves determining whether an area surrounding the target cell is identical to an area surrounding the preceding cell.

In a variation on this embodiment, prior to determining if the target cell is identical to the preceding cell, the system performs an overlap removal operation on the target cell and the preceding cell.

In a variation on this embodiment, the system distributes the plurality of cells to a set of parallel processors so that plurality of cells can be processed in parallel.

In a variation on this embodiment, processing the target cell involves performing, data fracturing, model-based optical proximity correction (OPC), rule-based optical proximity correction, or phase shifter assignment for the target cell.

DETAILED DESCRIPTION

Wafer Fabrication Process

Figure 1:
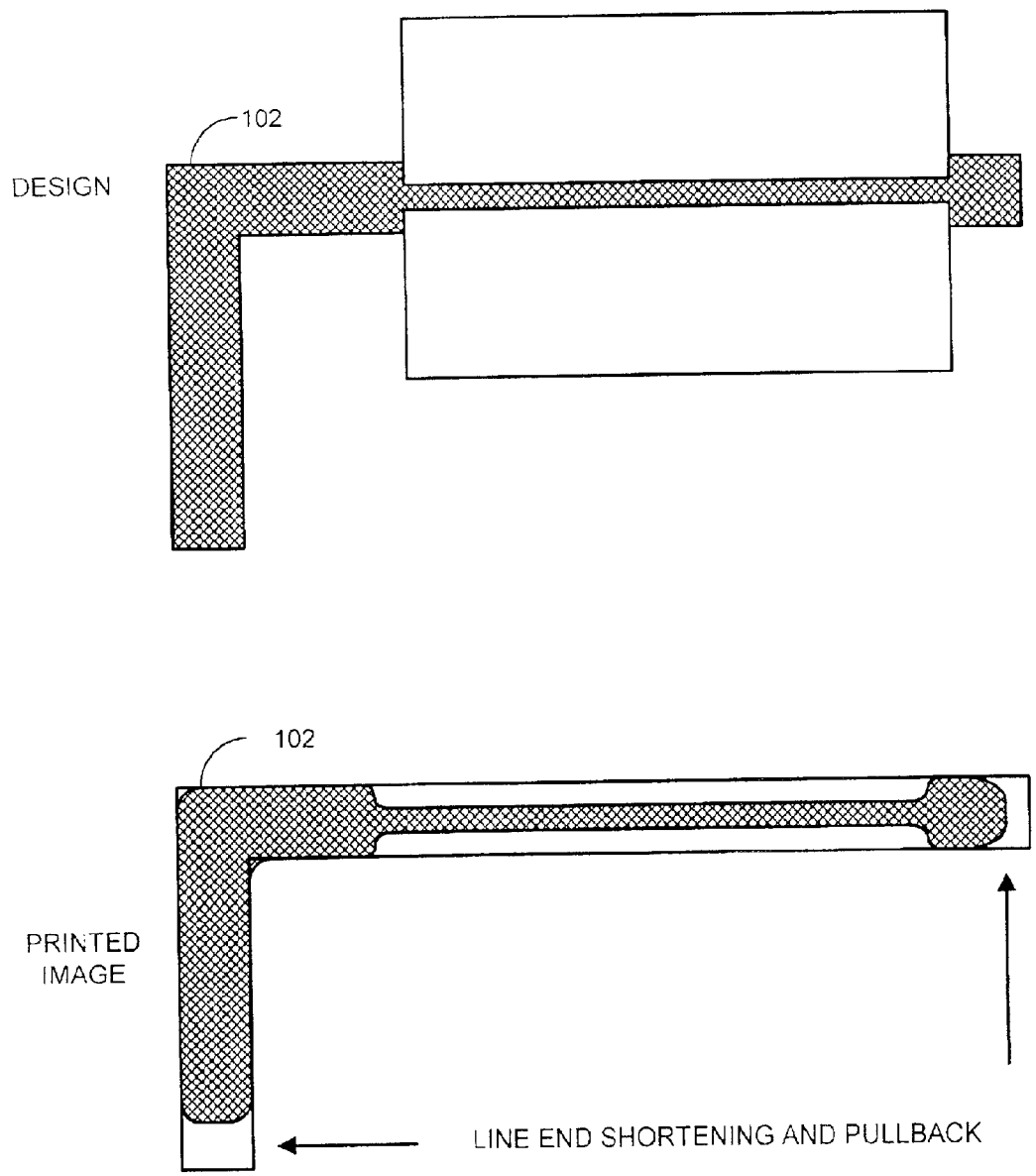
FIG. 1 illustrates the line end shortening problem.
Figure 2:
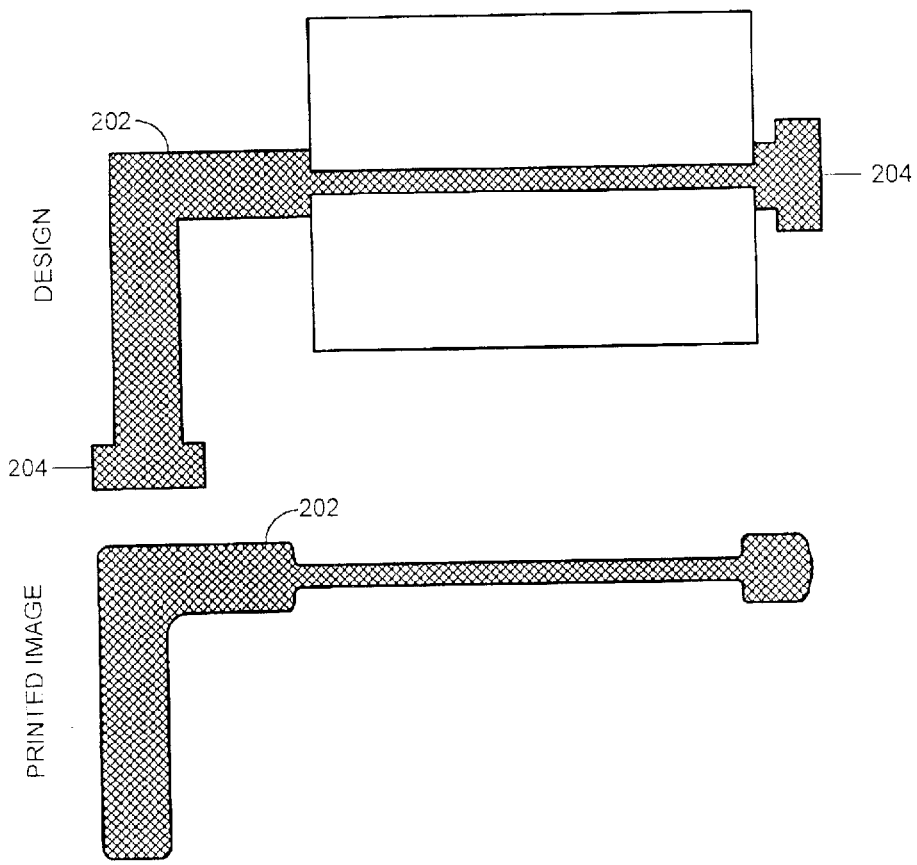
FIG. 2 illustrates the use of a hammerhead to compensate for the line end shortening problem.
Figure 3:
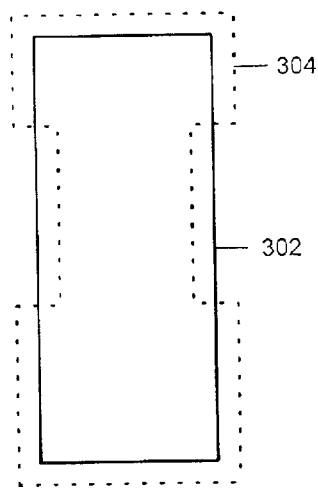
FIG. 3 illustrates a line end prior to and after optical proximity correction.
Figure 4:
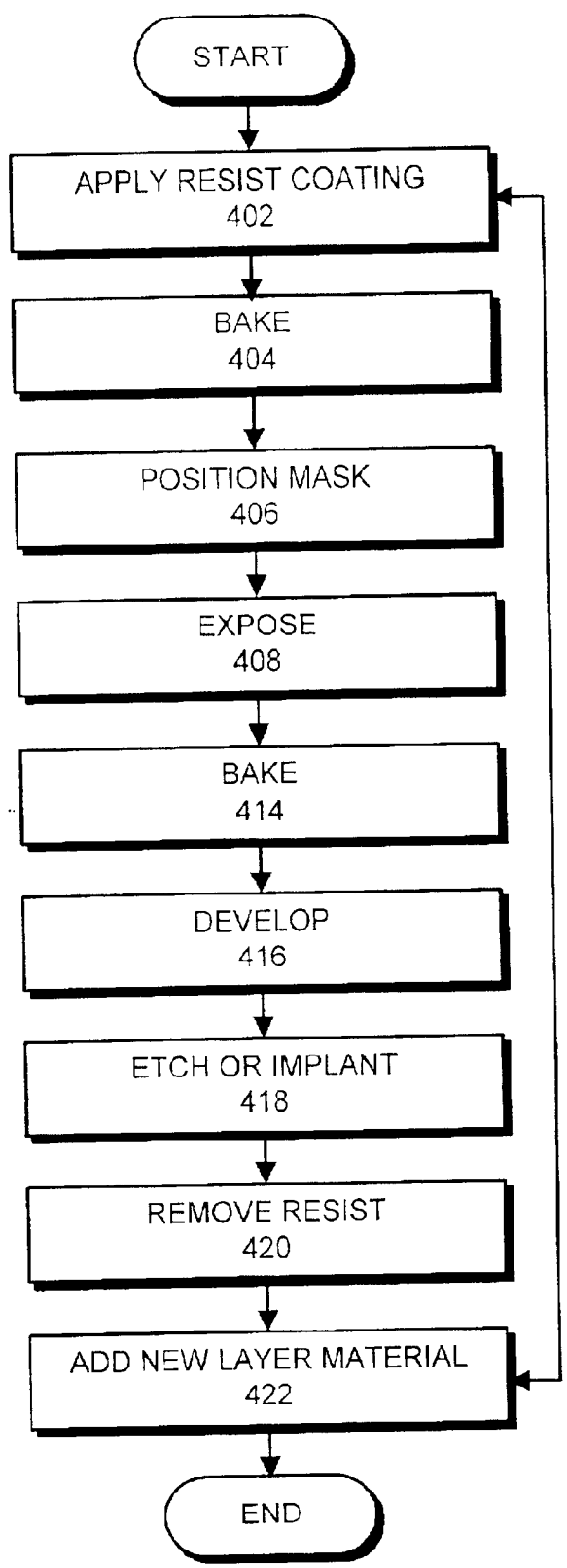
FIG. 4 is a flow chart illustrating the wafer fabrication process in accordance with an embodiment of the invention.

FIG. 4 is a flow chart illustrating the wafer fabrication process in accordance with an embodiment of the invention.

The system starts by applying a photoresist layer to the top surface of a wafer (step 402). Next, the system bakes the photoresist layer (step 404). The system then positions a mask over the photoresist layer (step 406), and exposes the photoresist layer through the mask (step 408). Next, the system optionally bakes the wafer again (step 414) before developing the photoresist layer (step 416). Next, either a chemical etching or ion implantation step takes place (step 418) before the photoresist layer is removed (step 420). (Note that in the case of a lift-off process, a deposition can take place.) Finally, a new layer of material can be added and the process can be repeated for the new layer (step 422).

Design Process

Figure 5:
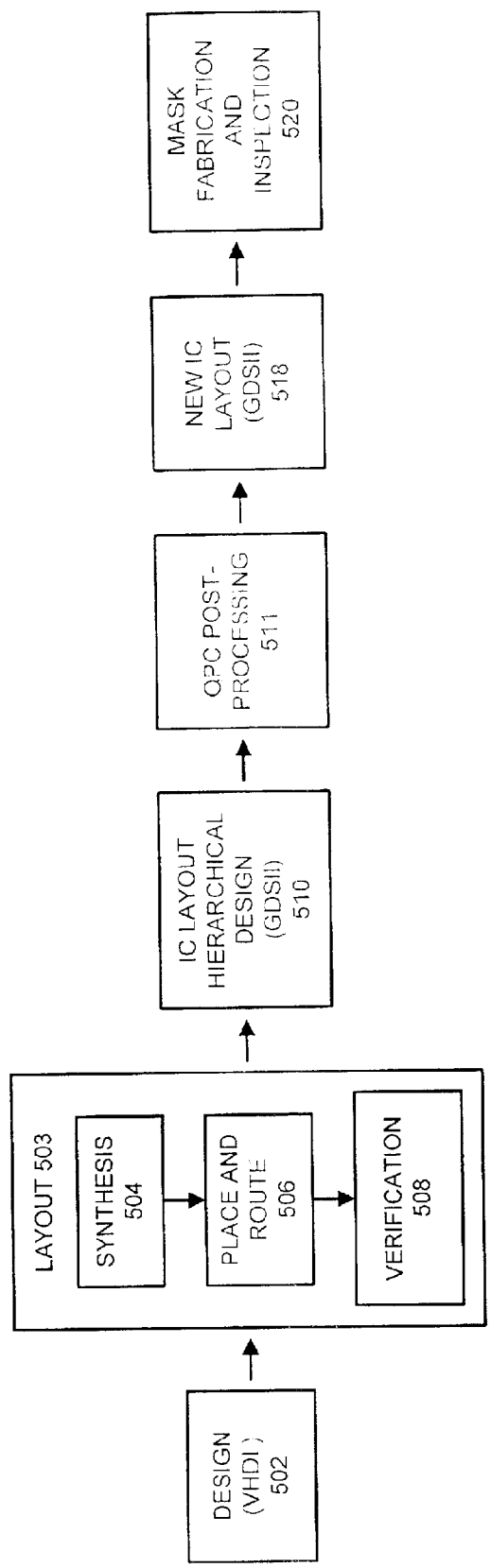
FIG. 5 illustrates the process of creating a mask to be used in fabricating an integrated circuit in accordance with an embodiment of the invention.

FIG. 5 illustrates the process of creating a mask to be used in the wafer fabrication process described above in accordance with an embodiment of the invention. The process starts when a circuit designer produces a design 502 in VHDL, or some other hardware description language. VHDL is an acronym for VHSIC Hardware Description Language. (VHSIC is a Department of Defense acronym that stands for very high-speed integrated circuits.) The VHDL standard has been codified in Institute for Electrical and Electronic Engineers (IEEE) standard 1076–1993.

Layout 502 then feeds through a layout system that performs a number of functions, such as synthesis 504, placement and routing 506 and verification 508. The result is an integrated circuit (IC) layout 510, which is in the form of a hierarchical specification expressed in a format such as GDSII.

IC layout 510 then passes into OPC post-processing system 511, which performs optical proximity corrections to compensate for optical effects that arise during the photolithography process.

The output of OPC post-processing system 511 is a new IC layout 518. New IC layout 518 subsequently passes into mask fabrication and inspection processes 520.

Iterative Process

Figure 6:
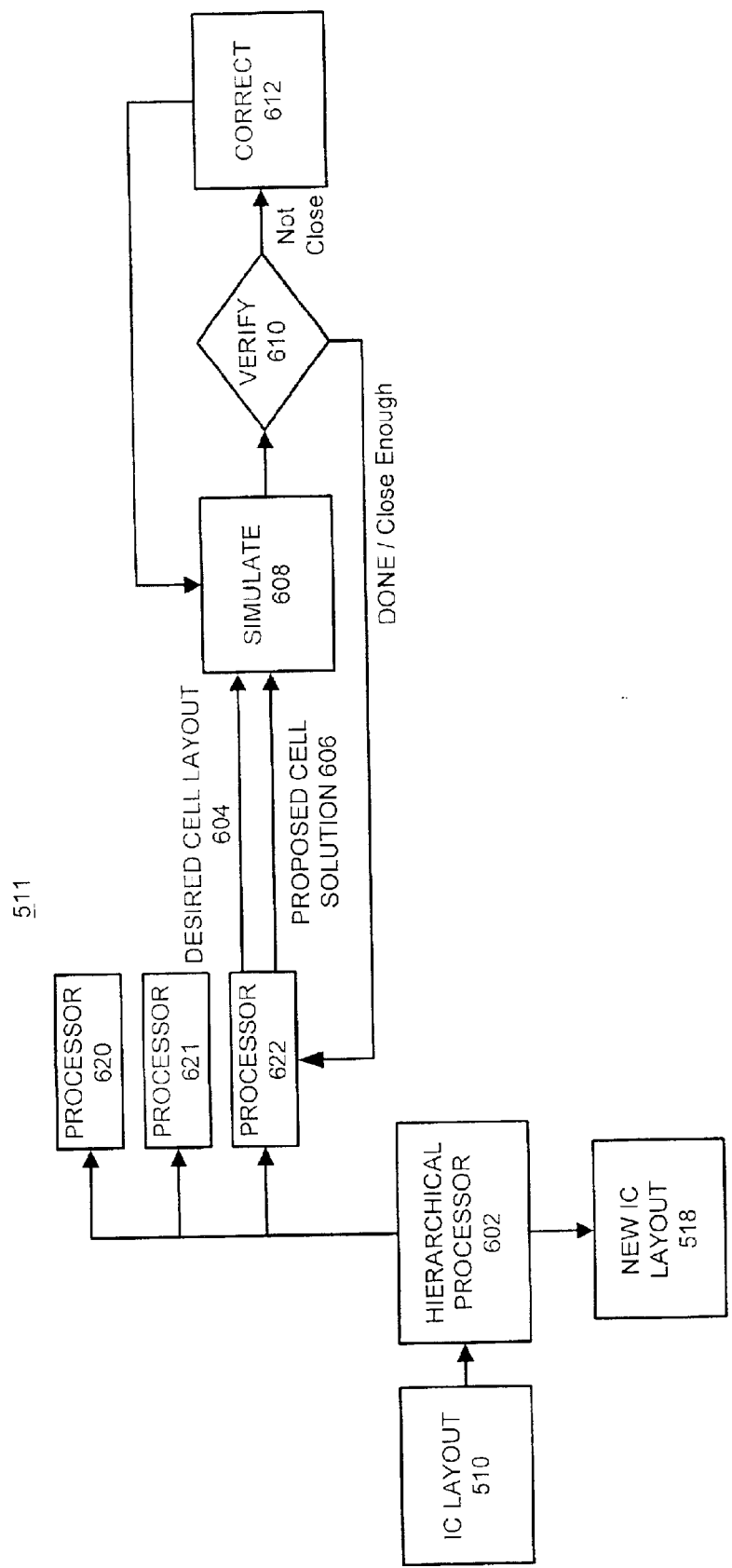
FIG. 6 illustrates an iterative process, such as OPC, involving simulation and correction in accordance with an embodiment of the invention.

FIG. 6 illustrates an iterative process, such as OPC, involving simulation and correction in accordance with an embodiment of the invention. Prior to the iterative process, IC layout 510 feeds into a hierarchical processor 602, which divides IC layout 510 into cells. (Note that hierarchical processor 602 can be implemented on, a single CPU, a process that can run on different CPUs, or a number of processes that can run on multiple CPUs.) Hierarchical processor 602 then distributes the cells to one or more processors to perform the iterative process. In a single CPU embodiment, one of the processors, e.g. the processor 622, may be the same physical CPU as the hierarchical processor 602. The simulation and correction loop on the right-hand side of FIG. 6 illustrates the operation of one such processor (e.g. the processor 622). However, note that hierarchical processor 602 can also communicate with other processors 620–622 that operate in parallel, for example as part of a distributed computing cluster.

Note that unlike in existing systems, processor 622 feeds both a desired cell layout 604 and a proposed solution 606 for a target cell into simulation unit 608. For example, the proposed solution 606 could be the post-OPC layout for a different cell that had a similar initial layout to the current cell, e.g. the desired cell layout 604. The process of selecting this proposed solution 606 is discussed in more detail with reference to FIG. 7 below. Additional shared storage (not shown) may be used to track prior solutions and hash codes as described below. In one embodiment, hierarchical processor 602 stores prior solutions and hash codes. In another embodiment, a separate processor is dedicated to answering requests for prior solutions.

The system then simulates the proposed solution 606 in simulation unit 608 to produce a simulation result for that layout. Next, this simulation result is verified in box 610 to determine if the manufactured result, as determined by simulation, (or "simulated result") is close enough to the desired cell layout 604 within a pre-specified tolerance, e.g. is it a match. If so, the process is complete and the solution is returned to hierarchical processor 602 to be included in new IC layout 518. Note, in some instances the solution is returned by simply indicating that a given cell can reuse an earlier cell's result with a specific orientation. This provides additional data volume savings.

Otherwise, the system corrects the solution 612 to compensate for differences between the then current solution and the desired cell layout 604. The corrected solution is then fed back into simulation unit 608 to repeat the process.

Note that by starting with a proposed solution 606 for a similar cell, fewer iterations of this process are typically needed to produce a solution for the target cell. This is because the first simulation is usually the most time-consuming because all edges must be considered. Subsequent simulations of similar cells merely have to correct previous simulations results in the proposed solution that were produced during the first simulation. Moreover, the proposed solution can include simulation results cached from a previous run through step 608, thereby saving even more time. Note that if the proposed solution is too far out of specification, the system simply starts the simulation over and disregards the proposed solution. Also note that if a solution can be reused for more than one cell, the size of the output file 518 can be reduced.

Processing a Cell Using a Suggested Solution

Figure 7:
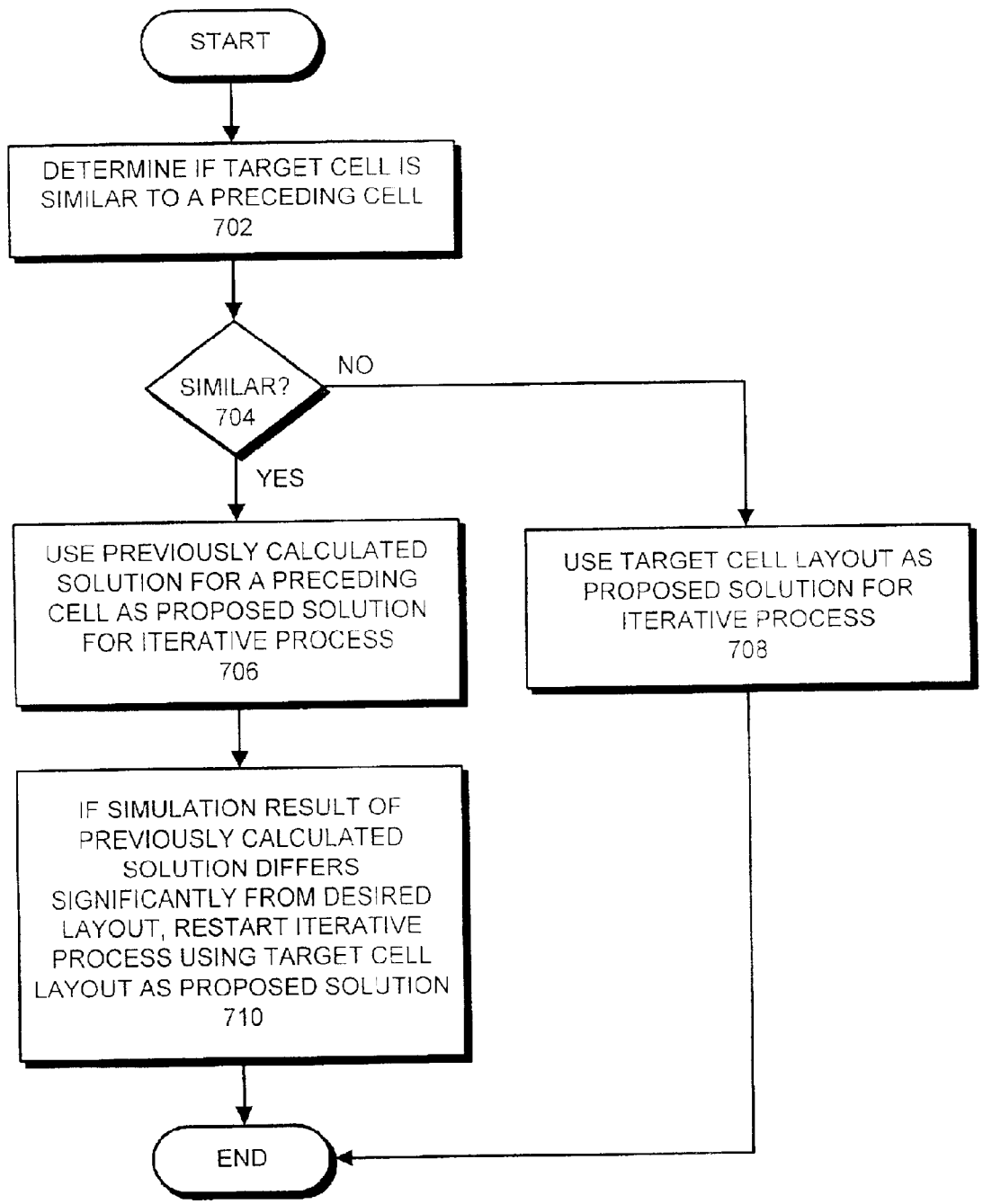
FIG. 7 is a flow chart illustrating the processing of a target cell in accordance with an embodiment of the invention.

FIG. 7 is a flow chart illustrating the processing of a cell using a suggested solution in accordance with an embodiment of the invention. The system starts by determining if the target cell is similar to a preceding cell for which a previously calculated solution already exists (step 702). This operation may involve accessing a database containing specifications for preceding cells.

In one embodiment, hierarchical processor 602 maintains such a database of cells and can be queried by the processors, e.g. processor 622.

In one embodiment of the invention, a preceding cell is similar to a target cell if the layout of the target cell matches the layout of the preceding cell, even if the environment surrounding the target cell differs from the environment surrounding the preceding cell.

In another embodiment of the invention, the target cell is similar to the preceding cell if the layout of the target cell differs from the layout of the preceding cell by less than a pre-specified amount.

If at step 704 the target cell is not similar to a preceding cell, the system uses the layout of the target cell itself as the proposed solution 606 for the iterative process (step 708).

Otherwise, if the target cell is similar to a preceding cell at step 704, the system uses the previously calculated solution for the preceding cell as the proposed solution 606 for the iterative process (step 706).

During the iterative process, if the simulation result of the previously calculated solution differs from the desired cell layout 604 by more than a pre-specified amount, the system ignores the previously calculated solution and restarts the iterative process using the layout of the target cell as the proposed solution 606 (step 710).

Figure 8:
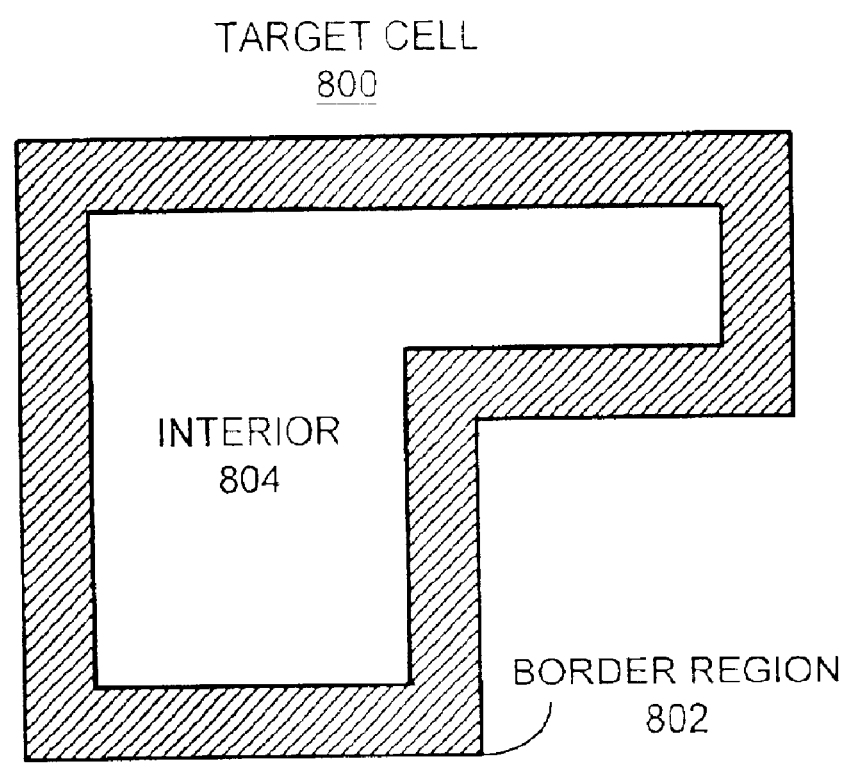
FIG. 8 is illustrates the border region and the interior of a cell in accordance with an embodiment of the invention.

Referring to the layout of target cell 800 in FIG. 8, note that if the layout of target cell 800 matches the layout of a preceding cell and only the cell environments differ, the iterative process only has to consider features within a border region 802 of target cell 800 that are close to the boundary of target cell 800 and can consequently be affected by the environment surrounding target cell 800. The system can ignore features in the interior 804 of target cell 800 that cannot be affected by the environment surrounding target cell 800.

Process of Using a Hash Code to Identify an Identical Cell

Figure 9:
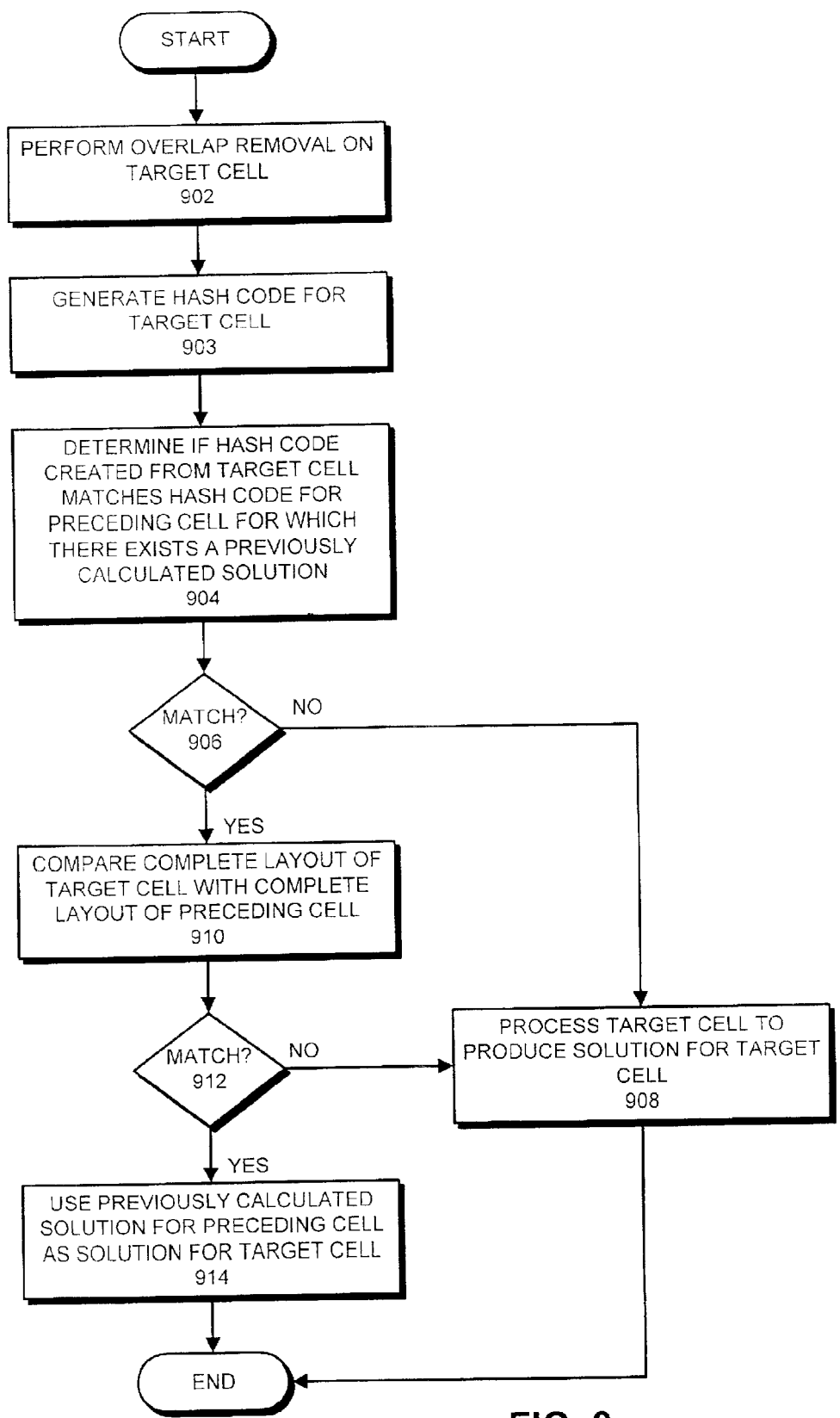
FIG. 9 is a flow chart illustrating the processing of a target cell in accordance with another embodiment of the invention.

FIG. 9 is a flow chart illustrating the processing of a target cell in accordance with another embodiment of the invention. The system starts by performing an overlap removal operation for features in the target cell (step 902). Next, the system generates a hash code for the target cell using various geometric properties of the cell (step 903). For example, some embodiments make use of the figure count, the edge count, the area, the perimeter, other properties, and/or combinations of properties to generate the hash code. This can be accomplished by using any one of a large number of well-known hash functions on the layout of the target cell after overlap removal has been performed.

Next, the system determines if the hash code for the target cell matches a hash code for another cell for which there exists a previously computed solution (step 904). This operation may involve accessing a database of containing specifications of preceding cells.

If at step 906 the hash code for the target cell does not match a hash code for a preceding cell, the system processes the target cell to produce a solution for the target cell (step 908). Note that this processing operation can include any type of operation that can be performed on cells in a layout for an integrated circuit. For example, the processing operation can involve data fracturing, model-based optical proximity correction (OPC), rule-based optical proximity correction, or phase shifter assignment for the target cell.

Otherwise, if at step 906 the hash code for the target cell matches a hash code for a preceding cell, the system compares the complete layout of the target cell with the complete layout of the preceding cell to ensure that the target cell is identical to the preceding cell (step 910).

If at step 912 these do not match, the system processes the target cell to produce a solution for the target cell (step 908).

Otherwise, if at step 912 the complete layouts match, the system uses the previously calculated solution for the preceding cell as a solution for the target cell (step 914).

Note that instead of (or in addition to) comparing hash codes, cells that are likely to be similar can be identified by looking at other cell attributes, such as cell size, cell name, or the number of polygons within a cell.

In one embodiment of the present invention, the above-described process is performed on a multiple processor system or a distributed processing configuration as is illustrated in FIG. 6. Note that such a system can use message passing or shared memory for communications between computing nodes.

The foregoing description is presented to enable one to make and use the invention, and is provided in the context of a particular application and its requirements. Various modifications to the disclosed embodiments will be readily apparent, and the general principles defined herein may be applied to other embodiments and applications without departing from the spirit and scope of the invention. Thus, the invention is not intended to be limited to the embodiments shown, but is to be accorded the widest scope consistent with the principles and features disclosed herein.

The data structures and code described in this detailed description can be stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Note that the invention can be applied to any type of lithographic process for fabricating semiconductor chips, including processes that make use of, deep-ultraviolet (DUV) radiation, extreme ultraviolet (EUV) radiation, X-rays, and electron beams, along with suitably modified masks.

The foregoing descriptions of embodiments of the invention have been presented for purposes of illustration and description only. They are not intended to be exhaustive or to limit the invention to the forms disclosed. Accordingly, many modifications and variations will be apparent. Additionally, the above disclosure is not intended to limit the invention. The scope of the invention is defined by the appended claims.

What is claimed is:

1. A method for speeding up processing of a layout of an integrated circuit that has been divided into cells, the method comprising:

determining if a target cell in the layout is identical to a preceding cell for which there exists a previously calculated solution by comparing a hash code created from the target cell with a hash code created from the preceding cell;

wherein prior to determining if the target cell is identical to the preceding cell, the method further comprises performing an overlap removal operation on the target cell and the preceding cell;

if the target cell is identical to the preceding cell, using the previously calculated solution as a solution for the target cell; and otherwise, if the target cell is not identical to the preceding cell, processing the target cell to produce the solution for the target cell.

2. The method of claim 1, wherein if the hash code created from the target cell matches the hash code created from the preceding cell, the method further comprises comparing a complete layout of the target cell with a complete layout of the preceding cell to ensure that the target cell is identical to the preceding cell.

3. The method of claim 1, wherein determining if the target cell is identical to a preceding cell involves determining whether an area surrounding the target cell is identical to an area surrounding the preceding cell.

4. The method of claim 1, wherein prior to said determining the target cell, the method further comprises:

receiving a specification for the layout of the integrated circuit; and dividing the layout into a plurality of cells, whereby each cell is independently processed.

5. The method of claim 4, further comprising distributing the plurality of cells to a set of parallel processors so that the plurality of cells are processed in parallel.

6. The method of claim 1, wherein processing the target cell involves performing one of:

model-based optical proximity correction (OPC);

rule-based optical proximity correction; and phase shifter assignment for the target cell.

7. A computer-readable storage medium storing instructions that when executed by a computer cause the computer to perform a method for speeding up processing of a layout of an integrated circuit that has been divided into cells, the method comprising:
  determining if a target cell in the layout is identical to a preceding cell for which there exists a previously calculated solution by comparing a hash code created from the target cell with a hash code created from the preceding cell;
  wherein prior to determining if the target cell is identical to the preceding cell, the method further comprises performing an overlap removal operation on the target cell and the preceding cell;
  if the target cell is identical to the preceding cell, using the previously calculated solution as a solution for the target cell; and
  otherwise, if the target cell is not identical to the preceding cell, processing the target cell to produce the solution for the target cell.

8. The computer-readable storage medium of claim 7, wherein if the hash code created from the target cell matches the hash code created from the preceding cell, the method further comprises comparing the gcomplete layout of the target cell with a complete layout of the preceding cell to ensure that the target cell is identical to the preceding cell.

9. The computer-readable storage medium of claim 7, wherein determining if the target cell is identical to a preceding cell involves determining whether an area surrounding the target cell is identical to an area surrounding the preceding cell.

10. The computer-readable storage medium of claim 8, wherein prior to said determining the target cell, the method further comprises:
  receiving a specification for the layout of the integrated circuit; and
  dividing the layout into a plurality of cells, whereby each cell is independently processed.

11. The computer-readable storage medium of claim 10, wherein the method further comprises distributing the plurality of cells to a set of parallel processors so that the plurality of cells are processed in parallel.

12. The computer-readable storage medium of claim 7, wherein processing the target cell involves performing one of:
  model-based optical proximity correction (OPC);
  rule-based optical proximity correction; and
  phase shifter assignment for the target cell.

13. An apparatus for speeding up processing of a layout of an integrated circuit that has been divided into cells, the apparatus comprising:
  a comparison mechanism that is configured to determine if a target cell in the layout is identical to a preceding cell for which there exists a previously calculated solution by comparing a hash code created from the target cell with a hash code created from the preceding cell;
  wherein prior to determining if the target cell is identical to the preceding cell, the comparison mechanism is further configured to perform an overlap removal operation on the target cell and the preceding cell;
  a processing mechanism that is configured to produce a solution for the target cell;
  wherein if the target cell is identical to the preceding cell, the target cell is configured to use the previously calculated solution as the solution for the target cell; and
  wherein if the target cell is not identical to the preceding cell, the processing mechanism is configured to process the target cell to produce the solution for the target cell.

14. The apparatus of claim 13, wherein if the hash code created from the target cell matches the hash code created from the preceding cell, the comparison mechanism is configured to compare a complete layout of the target cell with a complete layout of the preceding cell to ensure that the target cell is identical to the preceding cell.

15. The apparatus of claim 13, wherein the comparison mechanism is configured to determine whether an area surrounding the target cell is identical to an area surrounding the preceding cell.

16. The apparatus of claim 13, further comprising a partitioning mechanism that is configured to:
  receive a specification for the layout of the integrated circuit; and to
  divide the layout into a plurality of cells, whereby each cell is independently processed.

17. The apparatus of claim 16, further comprising a distribution mechanism that is configured to distribute the plurality of cells to a set of parallel processors so that the plurality of cells are processed in parallel.

18. The apparatus of claim 16, wherein the processing mechanism is configured to perform one of:
  model-based optical proximity correction (OPC);
  rule-based optical proximity correction; and
  phase shifter assignment for the target cell.

19. A mask to be used in an optical lithography process, wherein the mask is created through a method that speeds up processing of a layout of an integrated circuit that has been divided into cells, the method comprising:
  determining if a target cell in the layout is identical to a preceding cell for which there exists a previously calculated solution;
  wherein prior to determining if the tarnet cell is identical to the preceding cell, the method further comprises performing an overlap removal operation on the target cell and the preceding cell;
  if the target cell is identical to the preceding cell, using the previously calculated solution as a solution for the target cell; and
  otherwise, if the target cell is not identical to the preceding cell, processing the target cell to produce the solution for the target cell.

20. An integrated circuit created through a method that speeds up processing of a layout of an integrated circuit that has been divided into cells, the method comprising:
  determining if a target cell in the layout is identical to a preceding cell for which there exists a previously calculated solution;
  wherein prior to determining if the tantet cell is identical to the preceding cell, the method further comprises performing an overlap removal operation on the target cell and the precedina cell;
  if the target cell is identical to the preceding cell, using the previously calculated solution as a solution for the target cell; and
  otherwise, if the target cell is not identical to the preceding cell, processing the target cell to produce the solution for the target cell.

21. A method for performing distributed mask data preparation and model-based optical proximity correction, comprising:
  dividing an input layout into a plurality of jobs, wherein each job involves performing model based optical proximity corrections on a different portion of the layout;

distributing the plurality of jobs across a plurality of processors; and wherin, prior to distributing the input layout to the plurality of processors, the method comprises performing an overlap removal operation on a portion of the layout associated with a first job and a portion of the layout associated with a second job;

performing model-based optical proximity correction on the plurality of jobs in parallel on the plurality of processors.

22. The method of claim 21, further comprising:

determining if the portion of the layout associated with the first job is identical to the portion of the layout associated with the second job for which there exists a previously calculated solution by comparing a hash code created from the portion of the layout associated with the first job with a hash code created from the portion of the layout associated with the second job;

if the determination indicates the respective portions of the layouts are identical, using the previously calculated solution for the second job as a solution for the first job; and otherwise, if the determination indicates the respective portions of the layouts are not identical, performing model-based optical proximity correction on the portion of the layout associated with the first job to produce the solution for the first job.

23. The method of claim 22, wherein if the hash code created for the first job matches the hash code created for the second job, the method further comprises comparing the portion of the layout associated with the first job with the portion of the layout associated with the second job to ensure that the respective portions of the layout are identical.

* * * * *

UNITED STATES PATENT AND TRADEMARK OFFICE
CERTIFICATE OF CORRECTION

PATENT NO.   : 6,795,955 B2
DATED        : September 21, 2004
INVENTOR(S)  : Kevin D. MacLean and Roger W. Sturgeon It is certified that error appears in the above-identified patent and that said Letters Patent is hereby corrected as shown below:

Title page,
Item [56], References Cited, U.S. PATENT DOCUMENTS, please add the following:

| | | | | |
|---|---|---|---|---|
| -- 6,014,456 | 1/11/2000 | Tsudaka | 382/144 | 7/15/1996 |
| 6,154,563 | 11/28/2000 | Tsudaka | 382/144 | 12/17/1998 |
| 6,298,473 B1 | 10/2/2001 | Ono, et al. | 716/21 | 12/3/1998 |
| 6,339,836 B1 | 1/15/2002 | Eisenhofer, et al. | 716/5 | 8/24/1998 |
| 6,453,452 B1 | 9/17/2002 | Change. Et al. | 716/8 | 9/16/1998 |
| 6,453,457 B1 | 9/17/2002 | Pierrat, et al. | 716/19 | 9/29/2000 |
| 2002/0100004 A1 | 7/25/2002 | Pierrat, et al. | 716/5 | 3/15/2002 |
| 2002/0152449 A1 | 10/17/2002 | Lin | 716/17 | 4/13/2001 |
| 2002/0152454 A1 | 10/17/2002 | Cote, et al. | 716/21 | 6/7/2002 -- |

OTHER PUBLICATIONS, please add the following:
-- Cobb. N., et al., "Fast, Low-Complexity Mask Design", SPIE, Vol. 2440. pp. 313-327, February 22-24, 1995.
Cobb, N., et al., "Experimental Results on Optical Proximity Correction With Variable Threshold Resist Model", SPIE, Vol. 3051, pp. 458-468, March 12-14, 1997.
Cobb, N., "Fast Optical and Process Proximity Correction Algorithms for Integrated Circuit Manufacturing", Dissertation, University of California at Berkeley, UMI Microform 9902038 (139 pages), 1998.
Toublan, O., et al., "Phase Aware Proximity Correction for Advanced Masks", SPIE, Vol. 4000, pp. 160-170, March 1-3, 2000.
Anonymous, "Parameterization For Full Shape And Rule Dependent Dissection", IPCOM000009587D, September 4, 2002 (9 pages). --

Column 9,
Line 24, please delete the words, "the gcomplete" and replace with the words -- a complete --
Line 31, please delete the number, "8" and replace with the number -- 7 --

Column 10,
Line 51, please delete the word, "tantet" and replace with the word -- target --
Line 54, please delete the word, "precedina" and replace with the word -- preceding --

UNITED STATES PATENT AND TRADEMARK OFFICE
CERTIFICATE OF CORRECTION

PATENT NO. : 6,795,955 B2
DATED : September 21, 2004
INVENTOR(S) : Kevin D. MacLean and Roger W. Sturgeon It is certified that error appears in the above-identified patent and that said Letters Patent is hereby corrected as shown below:

<u>Column 11,</u>
Line 3, please delete the word, "wherin" and replace with the word -- wherein --

Signed and Sealed this

Eleventh Day of January, 2005

JON W. DUDAS
*Director of the United States Patent and Trademark Office*